(12) United States Patent  
Matsusaki (10) Patent No.: US 7,985,458 B2
(45) Date of Patent: Jul. 26, 2011

(54) CERAMIC MEMBER, METHOD OF FORMING GROOVE IN CERAMIC MEMBER, AND SUBSTRATE FOR ELECTRONIC PART

(75) Inventor: Takahiro Matsusaki, Kagoshsima (JP)

(73) Assignee: Kyocera Corporation, Kyoto (JP)

( * ) Notice: Subject to any disclaimer, the term of this patent is extended or adjusted under 35 U.S.C. 154(b) by 221 days.

(21) Appl. No.: 12/430,690

(22) Filed: Apr. 27, 2009

(65) Prior Publication Data

US 2009/0220721 A1    Sep. 3, 2009

Related U.S. Application Data

(63) Continuation-in-part of application No. PCT/JP2006/321800, filed on Oct. 31, 2006.

(51) Int. Cl.
  *B32B 3/30* (2006.01)
(52) U.S. Cl. ........... 428/43; 428/156; 428/167; 428/212
(58) Field of Classification Search .................. 428/43, 428/156, 167, 212; 264/400
  See application file for complete search history.

(56) References Cited

FOREIGN PATENT DOCUMENTS

| JP | 01-112794 | 5/1989 |
|---|---|---|
| JP | 05-252384 | 9/1993 |
| JP | 06-031479 | 2/1994 |
| JP | 08-141764 | 6/1996 |
| JP | 10-235914 | 9/1998 |
| JP | 2000-323441 | 11/2000 |
| JP | 2003-055044 | 2/2003 |
| JP | 2004-022643 | 1/2004 |
| JP | 2004-276386 | 10/2004 |
| JP | 2006-036602 | 2/2006 |

*Primary Examiner* — Alexander Thomas
(74) *Attorney, Agent, or Firm* — Procopio, Cory, Hargreaves & Savitch LLP (57) ABSTRACT

A ceramic member with high strength grooves and method of manufacturing same is disclosed. A heat ray may be used in combination with a blown gas to form grooves in the surface of the ceramic member while eliminating or minimizing depletion of a sintering aid. A high concentration of the sintering aid is formed in a surface region of the ceramic member extending a distance from the surface of the grooves into the ceramic member.

11 Claims, 11 Drawing Sheets

[Table 1]

| Sample No. | Laser beam irradiation conditions | | |
|---|---|---|---|
| | Irradiation temperature (°C) | Moving speed (m/minute) | Oscillation frequency |
| 1 | 2050 | 70 | 10000 |
| 2 | 2100 | 60 | 10000 |
| 3 | 2500 | 30 | 10000 |
| 4 | 2900 | 10 | 10000 |
| 5 | 2980 | 9 | 10000 |
| 6 | 2050 | 70 | 10000 |
| 7 | 2100 | 60 | 10000 |
| 8 | 2500 | 30 | 10000 |
| 9 | 2900 | 10 | 10000 |
| 10 | 2980 | 9 | 10000 |
| 11 | 2050 | 70 | 10000 |
| 12 | 2100 | 60 | 10000 |
| 13 | 2500 | 30 | 10000 |
| 14 | 2900 | 10 | 10000 |
| 15 | 2980 | 9 | 10000 |
| 16 | 2500 | 30 | 9000 |
| 17 | 2500 | 30 | 11000 |
| 18 | 2040 | 71 | 10000 |
| 19 | 2990 | 8.9 | 10000 |

FIG. 9

[Table 2]

| Sample No. | Silica content | | | Content in non-surface layer | | | Evaluation items | |
|---|---|---|---|---|---|---|---|---|
| | Surface layer (%) | Non-surface layer (%) | Ratio (−) | Alumina (%) | Calcia (%) | Magnesia (%) | Chipping | Transverse strength (MPa) |
| 1 | 2.75 | 2.5 | 1.1 | 96.0 | 0.2 | 1.3 | △ | 198 |
| 2 | 3.0 | 2.5 | 1.2 | 96.0 | 0.2 | 1.3 | ○ | 228 |
| 3 | 3.5 | 2.5 | 1.4 | 96.0 | 0.2 | 1.3 | ○ | 231 |
| 4 | 4.0 | 2.5 | 1.6 | 96.0 | 0.2 | 1.3 | ○ | 226 |
| 5 | 4.25 | 2.5 | 1.7 | 96.0 | 0.2 | 1.3 | △ | 199 |
| 6 | 5.5 | 5.0 | 1.1 | 92.6 | 0.4 | 2.0 | △ | 198 |
| 7 | 6.0 | 5.0 | 1.2 | 92.6 | 0.4 | 2.0 | ○ | 222 |
| 8 | 7.0 | 5.0 | 1.4 | 92.6 | 0.4 | 2.0 | ○ | 224 |
| 9 | 8.0 | 5.0 | 1.6 | 92.6 | 0.4 | 2.0 | ○ | 222 |
| 10 | 8.5 | 5.0 | 1.7 | 92.6 | 0.4 | 2.0 | △ | 194 |
| 11 | 0.33 | 0.3 | 1.1 | 99.6 | 0.0 | 0.1 | △ | 188 |
| 12 | 0.36 | 0.3 | 1.2 | 99.6 | 0.0 | 0.1 | ○ | 206 |
| 13 | 0.42 | 0.3 | 1.4 | 99.6 | 0.0 | 0.1 | ○ | 208 |
| 14 | 0.48 | 0.3 | 1.6 | 99.6 | 0.0 | 0.1 | ○ | 200 |
| 15 | 0.51 | 0.3 | 1.7 | 99.6 | 0.0 | 0.1 | △ | 184 |
| 16 | 3.5 | 2.5 | 1.4 | 96.0 | 0.2 | 1.3 | ○ | 210 |
| 17 | 3.5 | 2.5 | 1.4 | 96.0 | 0.2 | 1.3 | ○ | 238 |
| 18 | − | 2.5 | − | 96.0 | 0.2 | 1.3 | − | − |
| 19 | 1.9 | 2.5 | 0.6 | 96.0 | 0.2 | 1.3 | × | 166 |

It was not possible to form grooves in Sample No. 18.
Projections were formed around grooves in Sample No. 19.

[Table 3]

| Sample No. | Laser beam irradiation conditions | | |
|---|---|---|---|
| | Irradiation temperature (°C) | Moving speed (m/minute) | Oscillation frequency |
| 20 | 3300 | 70 | 10000 |
| 21 | 3350 | 60 | 10000 |
| 22 | 3850 | 30 | 10000 |
| 23 | 4300 | 10 | 10000 |
| 24 | 4400 | 9 | 10000 |
| 25 | 3300 | 70 | 10000 |
| 26 | 3350 | 60 | 10000 |
| 27 | 3850 | 30 | 10000 |
| 28 | 4300 | 10 | 10000 |
| 29 | 4400 | 9 | 10000 |
| 30 | 3300 | 70 | 10000 |
| 31 | 3350 | 60 | 10000 |
| 32 | 3850 | 30 | 10000 |
| 33 | 4300 | 10 | 10000 |
| 34 | 4400 | 9 | 10000 |
| 35 | 3850 | 30 | 9000 |
| 36 | 3850 | 30 | 11000 |
| 37 | 3290 | 71 | 10000 |
| 38 | 4410 | 8.9 | 10000 |

FIG. 15

[Table 4]

| Sample No. | Yttria content | | | Content in non-surface layer | Evaluation items | |
|---|---|---|---|---|---|---|
| | Surface layer (%) | Non-surface layer (%) | Ratio (-) | Zirconia (%) | Chipping | Transverse strength (MPa) |
| 20 | 6.1 | 5.5 | 1.1 | 94.5 | △ | 242 |
| 21 | 6.6 | 5.5 | 1.2 | 94.5 | ○ | 296 |
| 22 | 7.7 | 5.5 | 1.4 | 94.5 | ○ | 299 |
| 23 | 8.8 | 5.5 | 1.6 | 94.5 | ○ | 296 |
| 24 | 9.4 | 5.5 | 1.7 | 94.5 | △ | 249 |
| 25 | 6.4 | 5.8 | 1.1 | 94.2 | △ | 236 |
| 26 | 7.0 | 5.8 | 1.2 | 94.2 | ○ | 284 |
| 27 | 8.1 | 5.8 | 1.4 | 94.2 | ○ | 290 |
| 28 | 9.3 | 5.8 | 1.6 | 94.2 | ○ | 286 |
| 29 | 9.9 | 5.8 | 1.7 | 94.2 | △ | 238 |
| 30 | 5.7 | 5.2 | 1.1 | 94.8 | △ | 248 |
| 31 | 6.2 | 5.2 | 1.2 | 94.8 | ○ | 294 |
| 32 | 6.8 | 5.2 | 1.4 | 94.8 | ○ | 298 |
| 33 | 8.3 | 5.2 | 1.6 | 94.8 | ○ | 255 |
| 34 | 8.8 | 5.2 | 1.7 | 94.8 | △ | 242 |
| 35 | 7.7 | 5.5 | 1.4 | 94.5 | ○ | 252 |
| 36 | 7.7 | 5.5 | 1.4 | 94.5 | ○ | 300 |
| 37 | - | 5.5 | - | 94.5 | - | - |
| 38 | 3.5 | 5.5 | 0.6 | 94.5 | × | 210 |

It was not possible to form grooves in Sample No. 37.
Projections were formed around grooves in Sample No. 38.

CERAMIC MEMBER, METHOD OF FORMING GROOVE IN CERAMIC MEMBER, AND SUBSTRATE FOR ELECTRONIC PART

CROSS-REFERENCE TO RELATED APPLICATION

This application is a continuation in part based on PCT application PCT/JP2006/321800 filed on Oct. 31, 2006, the entirety of which is incorporated by reference herein.

FIELD OF INVENTION

Embodiments of the present disclosure relate generally to ceramic structures, and more particularly relate to ceramic structures for electronics.

BACKGROUND OF THE INVENTION

A method for efficiently producing substrates for electronic parts generally includes forming a conductor on a ceramic member having dividing grooves and then dividing the ceramic member along the dividing grooves into a large number of pieces.

The dividing grooves in a ceramic member are dominantly formed by pressing a blade attached to a die against an unbaked ceramic green sheet. The unbaked ceramic green sheet is then baked, and as a result, a problem may occur in which the dimensional accuracy may be poor due to uneven contraction of the product during sintering. Furthermore, a large ceramic member is necessary to produce a large number of substrates for electronic parts at once. However, such a large ceramic member may have a serious problem with dimensional accuracy.

The dividing grooves are also formed by a method of applying laser beams to a work piece. Such a laser machining method includes a laser abrasion technique. In this method, the work piece is locally melted and vaporized by laser irradiation so that a part of the work piece can be removed. A groove can be formed by moving the laser beam across the work piece.

The ceramic member mainly includes a ceramic material as a main ceramic component and contains a sintering aid. Therefore, when the laser machining method is performed on the ceramic member, the laser-irradiated portion is instantaneously and explosively removed causing a large amount of the sintering aid to be vaporized and lost from the surface of the groove.

In conventional laser machining, grooves are formed at a temperature such that the main ceramic component is vaporized. Therefore, the content of a sintering aid which has a boiling point lower than that of the main ceramic component can be significantly reduced in a surface layer of the grooves in the ceramic member. In particular, a sintering aid such as silica or yttria can be significantly reduced, so that mutual bonding strength between ceramic grains of the main ceramic component is reduced. In this manner, shortage of the sintering aid can cause the surface layer of the grooves to have low strength. Therefore, there is a need for materials and methods of manufacturing that allow formation of high strength grooves.

SUMMARY

A ceramic member with high strength grooves and method of manufacturing same is disclosed. A heat ray may be used in combination with a blown gas to form grooves in the surface of the ceramic member while eliminating or minimizing depletion of a sintering aid. A high concentration of the sintering aid is formed in a surface region of the ceramic member extending a distance from the surface of the grooves into the ceramic member.

A first embodiment comprises a ceramic member. The ceramic member comprises at least one groove formed in a surface of the ceramic member, and a first region located at a first depth ranging from about 1 µm to about 10 µm perpendicular to a surface of the at least one groove. The ceramic member further comprises a second region located at a second depth ranging from about 60 µm to about 70 µm perpendicular to the surface of the at least one groove. The ceramic member also comprises a sintering aid, wherein the sintering aid content is higher in the first region than in the second region.

A second embodiment comprises a method of forming a groove in a ceramic member. The method comprises applying a heat ray to a surface of the ceramic member, and blowing a gas on the surface. The method further comprises heating a portion of the surface to within a temperature range, and moving the heat ray to form the groove.

A third embodiment comprises a substrate for electronic parts. The substrate comprises a ceramic member, and a groove formed in a peripheral portion of the ceramic member. The substrate further comprises a first region located at a first depth ranging from about 1 µm to about 10 µm perpendicular to the surface of the groove, and a second region located at a second depth ranging from about 60 µm to about 70 µm perpendicular to the surface of the groove. The substrate also comprises a sintering aid, wherein a content of the sintering aid is higher in the first region than in the second region.

BRIEF DESCRIPTION OF THE DRAWINGS

Embodiments of the present disclosure are hereinafter described in conjunction with the following figures, wherein like numerals denote like elements. The figures are provided for illustration and depict exemplary embodiments of the disclosure. The figures are provided to facilitate understanding of the disclosure without limiting the breadth, scope, scale, or applicability of the disclosure. The drawings are not necessarily made to scale.

DETAILED DESCRIPTION OF EXEMPLARY EMBODIMENTS

The following description is presented to enable a person of ordinary skill in the art to make and use the embodiments of the disclosure. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the invention. Thus, embodiments of the present disclosure are not intended to be limited to the examples described herein and shown, but are to be accorded a scope consistent with the claims.

Embodiments of the disclosure are described herein in the context of a practical non-limiting application, namely, for patterning conductors. Embodiments of the disclosure, however, are not limited to such conductor applications, and the techniques described herein may also be utilized for other applications. For example, embodiments may be applicable to patterning waveguides and the like.

In the following description of exemplary embodiments, reference is made to the accompanying drawings which form a part hereof, and in which it is shown by way of illustration specific embodiments in which the invention may be practiced. It is to be understood that other embodiments may be utilized and structural changes may be made without departing from the scope of the present disclosure. For the sake of brevity, conventional techniques and components related to a ceramic member and forming same, functional aspects of manufacturing and the individual operating components of manufacturing devices may not be described in detail herein.

Figure 1:
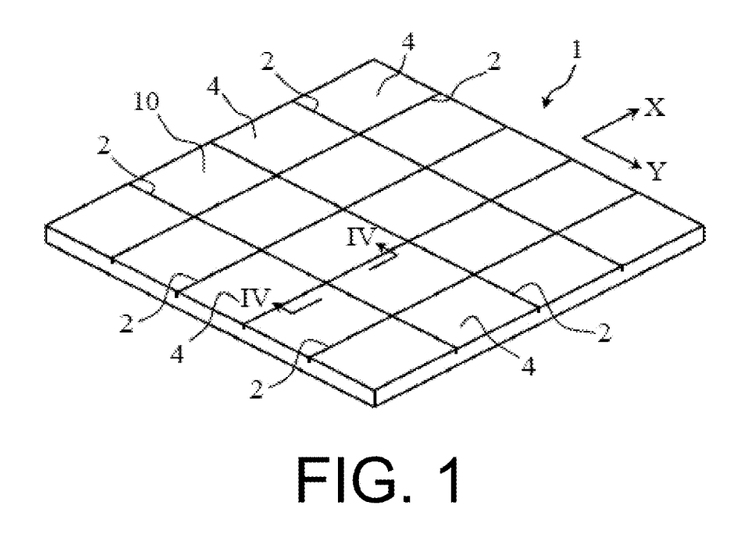
FIG. 1 illustrates a perspective view showing an exemplary ceramic member according to an embodiment of the disclosure.
Figure 3:
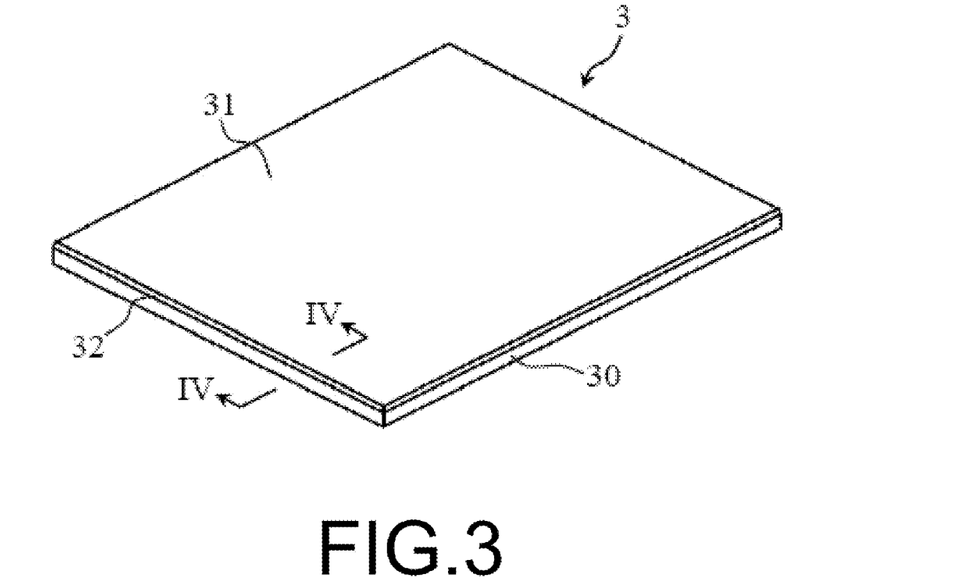
FIG. 3 illustrates a perspective view showing an exemplary substrate for electronic parts according to an embodiment of the disclosure.
Figure 4:
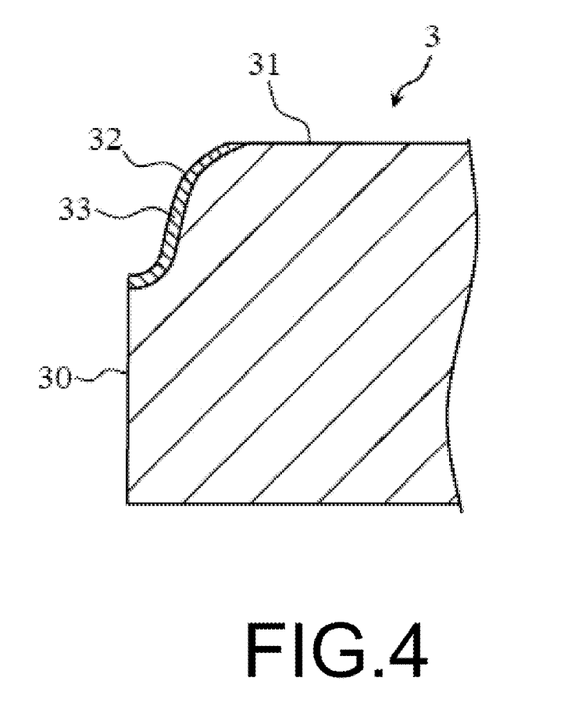
FIG. 4 illustrates a cross-sectional view along line IV-IV of FIG. 3.

FIG. 1 illustrates a perspective view showing an exemplary ceramic member 1 according to an embodiment of the disclosure. As shown in FIG. 1, the ceramic member 1 may comprise a plurality of grooves 2, a plurality of areas 4, and a conductor (not shown). The plurality of grooves 2 are used to divide the ceramic member 1 into a plurality of substrates for making electronic parts 3 as shown in FIGS. 3 and 4 below. The conductor is formed in each of the areas 4 defined by the grooves 2. After the grooves 2 are formed, the conductor may be formed or patterned by forming a film by screen printing, thin film vapor deposition, or the like and baking the film at a specific temperature.

The ceramic member 1 may comprise a ceramic material as a main component, such as but without limitation, alumina, zirconia, mullite, steatite, forsterite, silicon nitride, alumina-zirconia, or the like. The ceramic member 1 may also comprise a sintering aid, such as but without limitation, silica, yttria, magnesia, calcia, or the like.

Figure 2:
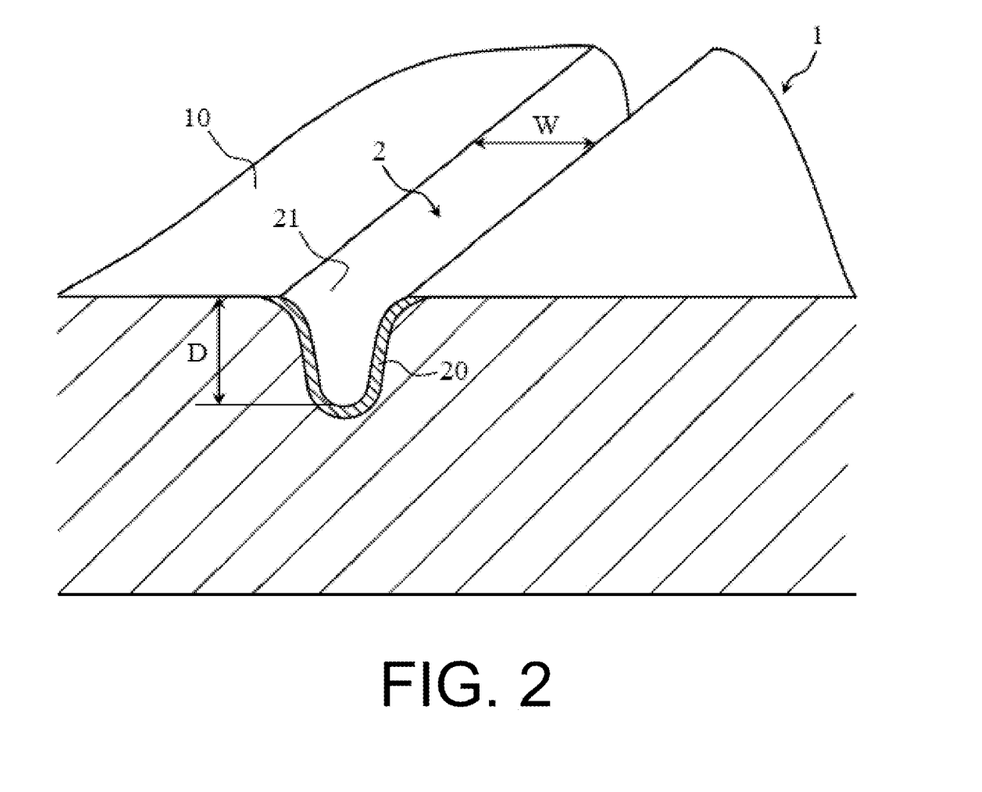
FIG. 2 is a cross-sectional view along line IV-IV of FIG. 1.

The average content of the main component in the ceramic member 1 (exclusive of the conductor) may be from about 92.6% by mass to about 99.6% by mass for alumina in a region (second region) located at depths ranging from about 60 μm to about 70 μm along a perpendicular direction from surface 21 of groove 2. Alternatively, the main component may be from about 94.2% by mass to about 94.8% by mass for zirconia in the second region.

If alumina is used as the main component, silica may be used as a sintering aid. If zirconia is used as the main component, yttria may be used as a sintering aid. An average content of the sintering aid (exclusive of the conductor) may be from about 0.3% by mass to about 5.0% by mass for silica in the second region, or from about 5.2% by mass to about 5.8% by mass for yttria in the second region. An average contents of magnesia and calcia may be from 0% by mass to about 0.4% by mass and from about 0.1% by mass to about 2.0% by mass, respectively, in the second region.

An average content of the main component (such as alumina or zirconia) or the sintering aid (such as silica or yttria) in the second region may be measured by a process including etching the second region by Focused Ion Beam (FIB) machining, while performing the measurement on a about 50 μm square area using wavelength dispersive Electron Probe Micro Analyzer (EPMA) analysis. Alternatively, the average content of the main component or the sintering aid in the second region may also be measured by a process including forming a cross-section of the second region and performing the measurement on an about 5 μm square area using wavelength dispersive EPMA analysis. In the EPMA analysis, carbon or the like may be vapor-deposited on a surface to be measured, and the measurement conditions preferably include an accelerating voltage of about 10 to about 20 kV and a probe current of about $2 \times 10^{-7}$ to about $4 \times 10^{-7}$ A.

The grooves 2 are used to divide the ceramic member 1 into parts by applying a load to the ceramic member 1. The grooves 2 include a plurality of X grooves extending in the X direction and being equally spaced in the Y direction and a plurality of Y grooves extending in the Y direction and being equally spaced in the X direction. In this manner, substrates for electronic parts 3 (FIGS. 3-4) obtained by dividing the ceramic member 1 along the grooves 2 can have the same shape.

FIG. 2 is a cross-sectional view along a line IV-IV of FIG. 1. For example, in the embodiment shown in FIG. 2, each groove 2 may be formed to have a width W of about 110 μm to about 150 µm and a depth D of about 120 µm to 180 µm. Each groove 2 comprises a surface layer 20, and the content of the specific sintering aid in the surface layer 20 may be from about 1.2 times to about 1.6 times the average content of the sintering aid in the second region. In this manner, an amount of silica or yttria is adequate to be uniformly interposed between the ceramic grains in the surface layer 20 so that the ceramic member 1 can have a high level of sintered properties and strength. More specifically, when the main component of the ceramic member 1 comprises alumina, the content of ceria in the surface layer 20 is from about 0.36% by mass to about 8.0% by mass, or when the main component of the ceramic member 1 comprises zirconia, the content of yttria in the surface layer 20 is from about 6.24% by mass to about 9.28% by mass.

The surface layer 20 of the groove 2 comprises at least a region located at depths ranging from 0 to about 10 µm along the perpendicular direction from the surface 21 of the groove 2. A content of silica or yttria in the surface layer 20, in the region located at depths ranging from about 0 to less than about 1 µm along the perpendicular direction from the surface 21 of the groove 2 may be ignored. This is because it may be difficult to precisely determine the content of silica or yttria in the region from the surface 21 of the groove 2 to a depth of less than 1 µm due to contamination. As used herein, the content of silica or yttria in the surface layer 20 of the groove 2 means a value measured in the region (first region) located at depths ranging from about 1 µm to about 10 µm along the perpendicular direction from the surface 21. The content of silica or yttria in the surface layer 20 of the groove 2 is preferably measured in a region located at depths ranging from about 1 µm to about 3 µm along the perpendicular direction from the surface 21 of the groove 2.

A content of each component in the surface layer 20 of the groove 2 may be quantitatively analyzed in a about 50 µm square region located at a specific depth by wavelength dispersive EPMA analysis (wavelength dispersive X-ray microanalyzer analysis). In the EPMA analysis, carbon is vapor-deposited on the surface to be measured, and the measurement conditions include an accelerating voltage of about 15 kV and a probe current of about $3.0 \times 10^{-7}$ A.

Conventional laser beam machining to form grooves 2 is performed, as explained in more detail below in the context of discussion of FIGS. 17-18, at a temperature such that the ceramic main component can be vaporized. In this conventional process, therefore, the content of a sintering aid in the surface layer of a groove in a ceramic member 1 can be significantly reduced, because the sintering aid has a boiling point lower than that of the main ceramic component. In particular, a sintering aid such as of silica, yttria or the like is significantly reduced so that the bonding between the ceramic grains of the main ceramic component is reduced. As a result, the surface layer 20 of grooves 2 formed by conventional methods can have low strength due to a sintering aid shortage.

However, in the ceramic member 1 according to an embodiment of the disclosure, the content of the sintering aid in the surface layer 20 of the groove 2 is higher than the average contents of the sintering aid in the second region thereby depletion of the sintering aid is eliminated or reduced. For example, according to various embodiments of the disclosure, silica or yttria is used as a sintering aid, when a ceramic material mainly including alumina or zirconia is produced by sintering. Therefore, the mutual bonding strength between alumina grains or zirconia grains in the surface layer 20 increases with increasing the content of a sintering aid such as silica or yttria in the surface layer 20. As a result, an end face 30 of the substrate for electronic parts 3 shown in FIGS. 3 and 4 is prevented from chipping, when it is produced by dividing the ceramic member 1. In this manner, the substrate for the electronic parts 3 has high transverse strength.

After the grooves 2 are formed as described above, if necessary, a solidified melt deposited around the grooves 2 may be removed. For example, the solidified melt may be removed by cutting or laser etching.

FIG. 3 illustrates a perspective view showing an exemplary substrate for electronic parts 3 according to an embodiment of the disclosure. FIG. 4 illustrates a cross-sectional view along line IV-IV of FIG. 2. As shown in FIGS. 3 and 4, the ceramic member 1 is then divided along the grooves 2 into the substrates for electronic parts 3, as described above. The substrate for electronic parts 3 may comprise an end face 30, an electronic part main surface 31, a periphery 32, and an electronic part surface layer 33. As mentioned above, the content of the sintering aid such as silica or yttria in the surface layer 20 of the groove 2 is higher than their respective average contents in the second region. Therefore, in the substrate for electronic parts 3, the content of the sintering aid such as silica or yttria in the electronic part surface layer 33 on the periphery 32 of the electronic part main surface 31 is higher than the average content of the substrate for electronic parts 3 (exclusive of a patterned conductor) in the second region.

For a more specific example, the content of the sintering aid such as silica or yttria in the electronic part surface layer 33 on the periphery 32 of the electronic part main surface 31 is about 1.2 to about 1.6 times the average content of silica or yttria in the second region.

In one embodiment, the substrate for the electronic parts 3 mainly includes alumina. For example, in this case the second region has an average alumina content of about 92.6% by mass to about 99.6% by mass, an average silica content of about 0.3% by mass to about 5.0% by mass, an average CaO (calcium oxide) content of 0% by mass to about 0.4% by mass, and an average MgO (magnesium oxide) content of about 0.1% by mass to about 2.0% by mass. For example, the content of silica in the electronic part surface layer 33 on the periphery 32 is from about 0.36% by mass to about 8.0% by mass.

In one embodiment, the substrate for electronic parts 3 mainly includes zirconia. For example, in this case the second region has an average zirconia content of about 94.2% by mass to about 94.8% by mass, an average yttria content of about 5.2% by mass to about 5.8% by mass. For example, the content of yttria in the electronic part surface layer 33 on the periphery 32 is from about 6.24% by mass to about 9.28% by mass.

The average content of each component in the second region in the substrate for the electronic parts 3 and the content of ceria or yttria in the electronic part surface layer 33 on the periphery 32 may be measured by the same method as described above for the ceramic member 1 (see FIGS. 1 and 2).

In the substrate for the electronic parts 3 described above, the mutual bonding strength between grains of the main component such as alumina or zirconia is relatively high, because the content of the sintering aid in the electronic part surface layer 33 on the periphery 32 of the electronic part main surface 31 is higher than the average content of it in the second region. Therefore, as mentioned above, the substrate for the electronic parts 3 can be prevented from chipping at the end face 30 and have high transverse strength. In addition, the grooves 2 of the ceramic member 1 can be formed as continuous grooves having a smooth surface, so that the end face 30 of the substrate for electronic parts 3 can be smooth.

Therefore, chipping at the end face 30 is reduced or prevented, and higher transverse strength is provided.

Formation of the grooves 2 shown in FIGS. 1 and 2 is described below with reference to FIGS. 5 to 7 according to one or more embodiments of the disclosure.

Figure 5:
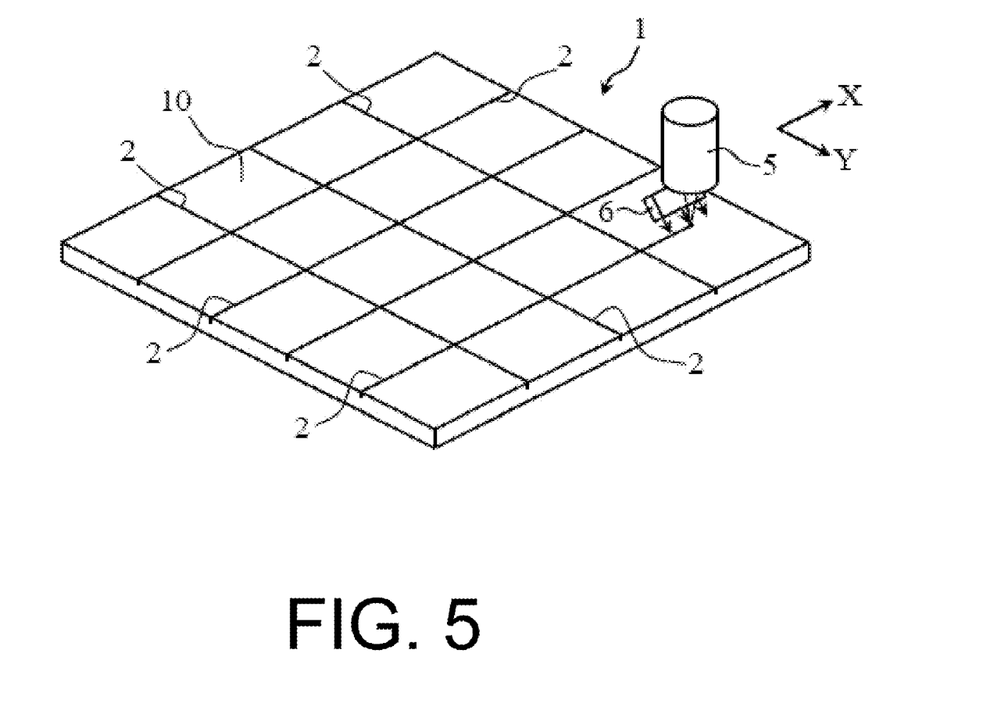
FIG. 5 illustrates a perspective view for showing an exemplary method of forming grooves in a ceramic member according to an embodiment of the disclosure.

FIG. 5 illustrates a perspective view for showing an exemplary method of forming grooves 2 in the ceramic member 1 according to an embodiment of the disclosure. As shown in FIG. 5, the grooves 2 may be formed by a process that includes applying heat rays via for example a device 5 for emitting laser beams to the main surface 10 of the ceramic member 1, while blowing gas thereto via a gas blowing device 6 and moving the heat rays along a given path. The laser beams for applying heat rays may include, for example but without limitation, a CO2 laser oscillator, a nitrogen laser oscillator, an excimer laser oscillator, or a YAG laser oscillator and the like. In order to produce high-power laser beams, a CO2 laser oscillator is preferably used.

The gas blowing device 6 is capable of blowing gas to an area with a size larger than a spot diameter DS (FIG. 6) of the heat ray. For example, the area on which the gas is blown has a size about 60 to about 100 times the spot diameter DS of the laser beam in the laser beam moving direction, and a size about 30 to about 50 times the spot diameter DS in the direction perpendicular to the moving direction. The gas to be blown may be compressed air, argon gas, oxygen gas, or the like. The gas blowing to such an area may be performed through an elliptical or rectangular gas outlet. In this case, the gas outlet may have a size of about 2.0 to about 3.3 mm in the long axis direction (the laser beam moving direction) and a size of about 1.0 to about 1.6 mm in the short axis direction (the direction perpendicular to the laser beam moving direction).

For example, the gas is blown at a pressure of about 0.4 to about 0.6 MPa. When the gas blowing pressure is set within such a range, the component melted by the laser beam irradiation can be well pushed out of the laser beam-irradiated portion so that a groove 2 with a smooth surface can be formed.

The gas may be blown in a direction parallel or oblique to the perpendicular direction of a main surface 10 of the ceramic member 1, preferably in an oblique direction at a tilt angle θ (FIG. 7) of about 55° to about 75° with respect to the perpendicular direction. When the gas is blown in an oblique direction to the ceramic member 1, the melted or vaporized ceramic component is pushed to a side relative to the laser beam oscillator 5. Therefore, the melted or vaporized ceramic component is prevented from being deposited on the optical system such as the light emitting face 50 and from contaminating the optical system. In this manner, even if the distance L between the light emitting face 50 of the laser beam oscillator 5 and the main surface 10 of the ceramic member 1 is set to about 1 cm, the optical system is not contaminated.

As mentioned above, when conventional laser beam machining is performed to form grooves, the temperature can be such that the ceramic main component is vaporized. Therefore, in the conventional process, because sintering aids have a boiling point lower than that of the main ceramic component, the content of a sintering aid in the surface layer of a groove in a ceramic member is significantly reduced.

Figure 6:
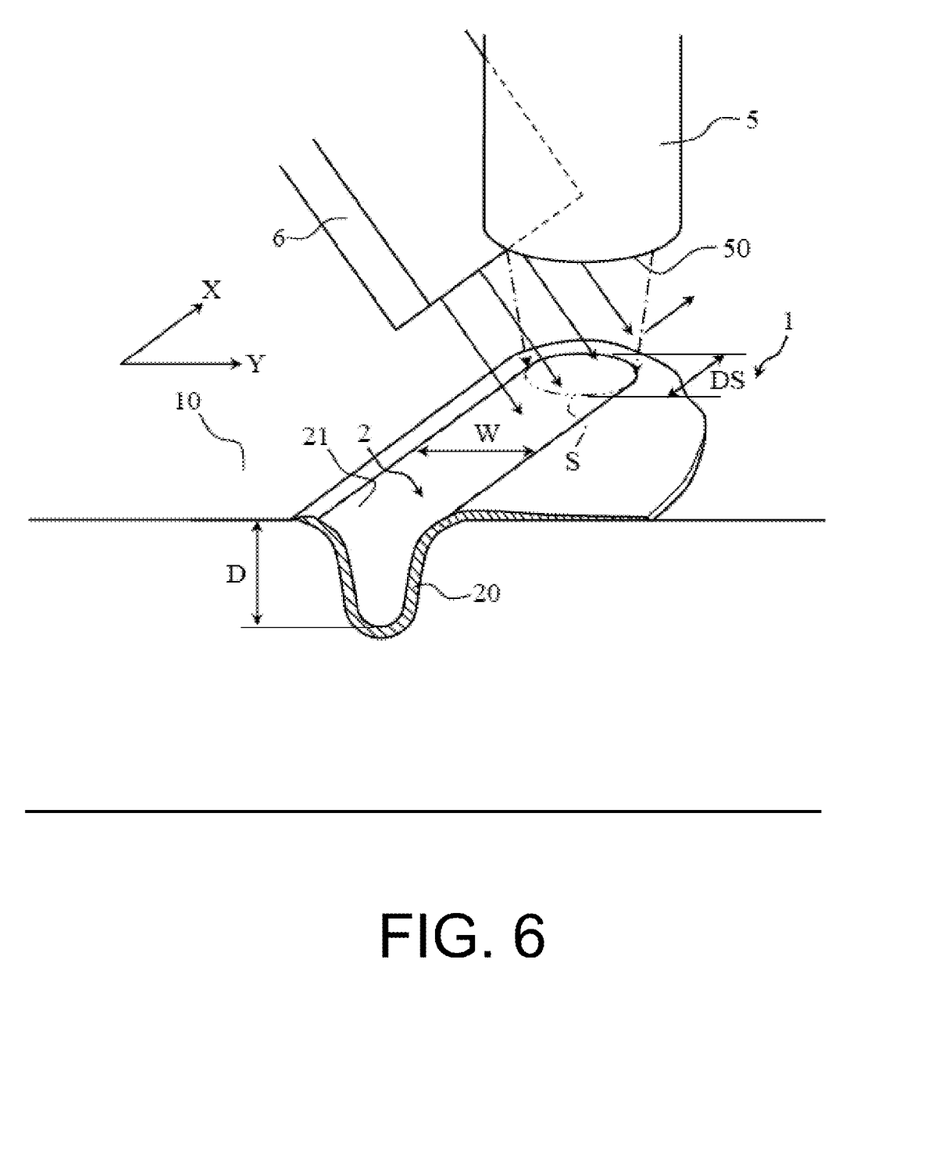
FIG. 6 illustrates a perspective view showing a principal part in an enlarged manner to illustrate an exemplary method of forming grooves in the ceramic member according to an embodiment of the disclosure.

FIG. 6 illustrates a perspective view showing a principal part in an enlarged manner to illustrate an exemplary method of forming the grooves 2 in the ceramic member 1 according to various embodiments of the disclosure. According to various embodiments of the disclosure the moving speed of the spot S (FIG. 6) is selected such that the temperature of the laser beam-irradiated portion can be controlled to a desired temperature. As a result, vaporization of the ceramic member 1 is reduced or prevented, which would otherwise be caused by excessive heat application, and the ceramic member 1 can be continuously melted to form the groove 2. In this manner, the resulting groove 2 is continuous and stable in width W and depth D (FIG. 6). Since the groove 2 is not formed like a perforated line (see FIG. 17) as formed by conventional laser machining, a reduction in the transverse strength of each substrate for electronic parts 3 (see FIGS. 3 and 4) is minimized or prevented, when the ceramic member 1 is divided into the substrates for electronic parts 3.

For example, the moving speed of the laser beam spot S is from about 9 m/minute to about 70 m/minute, preferably from about 10 m/minute to about 60 m/minute. If the moving speed of the spot S is too low, more heat than necessary may be applied at one location so that the main component or the sintering aid may be partially eliminated. Thereby, the surface layer 20 of the groove 2 may have a thermally-etched state as in conventional laser-machined articles (as explained below in the context of discussion of FIGS. 17-18), and the temperature of the laser beam-irradiated portion may be equal to or higher than the boiling point of the ceramic main component.

If the moving speed of the spot S is too high, it may be difficult to reduce the difference between the maximum and minimum values of the width of the groove 2. That is because existing pulse oscillation lasers have a laser power modulation limit of 25 kHz, and therefore, when laser machining is performed at a speed beyond the limit of the laser power modulation performance, a groove 2 may be formed similar to a groove 80 (FIG. 17) formed by conventional laser-machined articles. That is the groove 2 may be formed similar to a perforated line on a piece of paper due to the difference between the maximum and minimum values of the width W of the groove 2.

Figure 7:
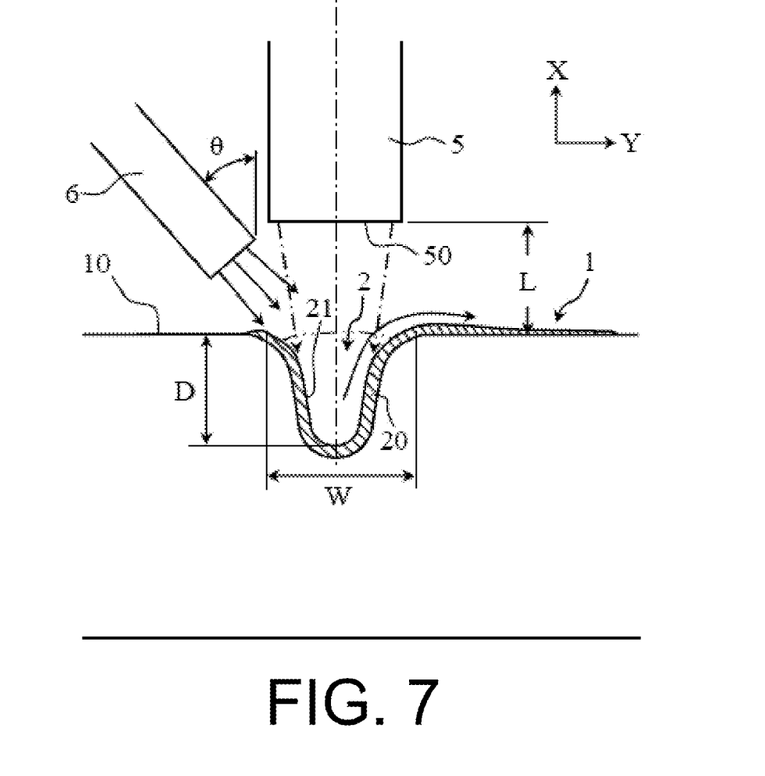
FIG. 7 illustrates a front view showing the principal part in an enlarged manner to illustrate an exemplary method of forming grooves in the ceramic member according to an embodiment of the disclosure.

FIG. 7 illustrates a front view showing the principal part in an enlarged manner to illustrate an exemplary method of forming the grooves 2 in the ceramic member 1 according to an embodiment of the disclosure. As shown in FIG. 7 a distance L between the light-emitting face 50 of the laser beam oscillator 5 (device 5) and the main surface 10 of the ceramic member 1 is set at to about 1 cm. Heat rays other than laser beams may also be used to apply thermal energy to the main surface 10 of the ceramic member 1, when the grooves 2 are formed. Gas is blown to the portion irradiated with heat rays, such as laser beams, in order to remove the melted ceramic material.

The laser beams may be applied to the ceramic member 1 in such a manner that the laser beam-irradiated portion has a temperature that is equal to or higher than the melting point of the main component of the ceramic member 1 and equal to or lower than the boiling point thereof. For example, such a temperature is from about 2050° C. to about 2980° C., preferably from about 2100° C. to about 2900° C., for the ceramic member 1 mainly including alumina, and from about 3300° C. to about 4400° C., preferably from about 3350° C. to about 4300° C., for the ceramic member 1 mainly including zirconia.

When the laser beam-irradiated portion has a temperature that is equal to or higher than the melting point of the main component of the ceramic member 1 and equal to or lower than the boiling point thereof, a target site of the ceramic member 1 can be adequately melted in the process of forming the grooves 2 so that vaporization of the main component and the sintering aid can be prevented. On the other hand, before the main component such as alumina or zirconia reaches its melting temperature, the sintering aid such as ceria or yttria is first melted in the laser beam-irradiated portion of the ceramic member 1. In the laser beam-irradiated portion, therefore, the melt of the sintering aid infiltrates into the surrounding area of the ceramic member 1, while it reacts with crystal grains of alumina or zirconia. As a result, the content of the sintering aid in the surface layer 20 of the groove 2 becomes higher than the average content of the sintering aid in the entire ceramic member 1. Therefore, the strength of mutual bonding between the grains of the main component such as alumina or zirconia becomes high in the surface layer 20 of the groove 2. In this manner, chipping at the end face 30 can be prevented when the ceramic member 1 is divided along the grooves 2 into the substrates for electronic parts 3 (see FIGS. 3 and 4), and each piece obtained by dividing the ceramic member 1 has high transverse strength.

Since the sintering aid is infiltrated into the ceramic member 1, the concentration of the sintering aid decreases with increasing depth in the surface layer 20 of the groove 2. Therefore, the surface layer 20 of the groove 2 has no clear interface and no concentrated stress, which would otherwise be produced in the presence of an interface, so that the surface layer 20 advantageously resists peeling.

Figure 8:
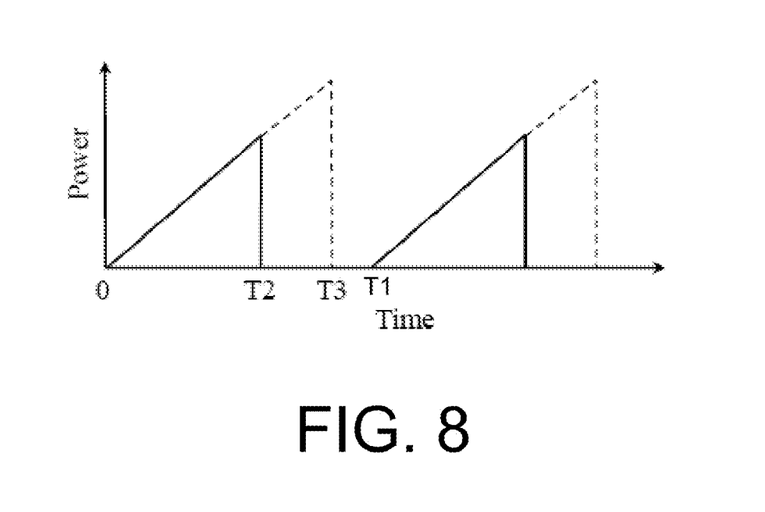
FIG. 8 is a graph for illustrating an exemplary pulse waveform used for laser beam radiation according to an embodiment of the disclosure.

FIG. 8 is a graph for illustrating an exemplary pulse waveform used for laser irradiation. FIG. 8 shows a pulse period T1, an excitation time T2, and an ON signal time T3 for laser actuation on a time vs. power graph. The temperature of the laser-irradiated portion may be determined based on the power, oscillating frequency, duty cycle, excitation time T2 (response time), spot shape, and laser beam moving speed. These factors may each be fixed or variable. For example, the power, excitation time, and spot shape may be fixed, and the frequency, duty cycle, and laser beam moving speed may be variable, when the temperature of the laser-irradiated portion is controlled. Herein, duty cycle is a value expressed by 100×(ON signal time T3)/(pulse period T1) (FIG. 8).

In one embodiment, the power, excitation time T2 and spot shape are fixed to be about 200 W, about 100 μsec, and an about 76 μm diameter circle, respectively. In this case, a temperature of about 2000° C. to about 4000° C., necessary for irradiation of the ceramic member 1 mainly including alumina or zirconia, can be achieved using an oscillating frequency of about 9000 to about 25000 Hz, a duty cycle of about 50% to about 85%, and a moving speed of about 8 m/minute to about 70 m/minute.

The temperature of the laser-irradiated portion may be determined using a conversion table of the laser irradiation conditions to the temperature. The conversion table may be prepared by a process that includes preparing different standard samples with various materials whose melting temperature is from about 2000 to about 4000° C. and irradiating each standard sample with laser beams under various laser irradiation conditions to examine the melting of the standard sample. Specifically, the conversion table may be prepared to correlate the process conditions at the beginning of the melting of the standard sample with the corresponding melting point of the standard sample. The temperature of the laser-irradiated portion may be directly or indirectly measured without using the conversion table.

The pulse oscillation frequency for laser irradiation is preferably about 5000 Hz or more (i.e., the pulse period T1 is preferably about 200 μsec or less), more preferably about 10000 Hz or more (i.e, the pulse period T1 is more preferably about 100 μsec or less). The upper limit of the pulse oscillation frequency may be about 25000 Hz (i.e., the pulse period T1 is about 40 μsec or less).

It is preferred that the pulse waveform be such that the excitation time T2 is relatively long and the ON signal time T3 (i.e., from time 0 to time T3) is relatively short (i.e., the T3≦T2≦T1). The laser beam oscillation with a pulse waveform of relatively short ON signal time T3 and relatively long excitation time T2 allows heat application with a controlled maximum temperature range. In addition, when the pulse period T1 is 200 μsec or less, the resulting laser pulse waveform is analogous to CW (Continuity Wave) continuous oscillation and the grooves 2 formed using the pulse waveform exhibit reduced variations in the depth D and the width W.

In FIG. 8, the solid line indicates a history of the actually-controlled laser power, and the dashed line indicates a hypothetical history until the completion of the laser power increase at time T2. In the laser beam oscillator 5, although the time to the completion of the laser power increase is nominally defined as the excitation time T2, in practice the OFF signal starting at the time T3 is before the completion of the laser power increase at time T2. In one embodiment, the pulse period T1 is from about 80 μsec to about 200 μsec, the excitation time T2 is between the laser oscillation and the time to reach a maximum temperature range is from about 80 μsec to about 200 μsec, and the ON signal time T3 is from about 40 μsec to about 170 μsec, wherein T3≦T2≦T.

Example 1

Figure 9:
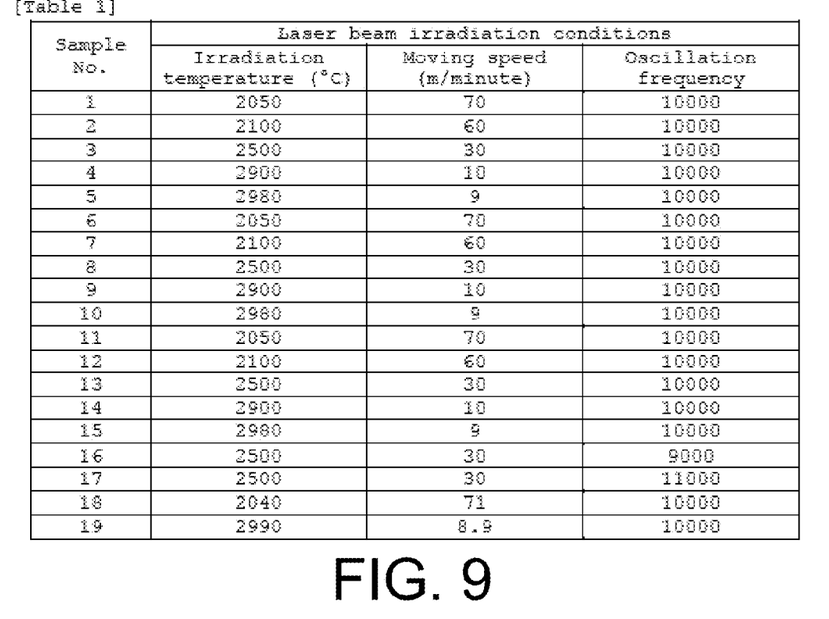
FIG. 9 is an exemplary table (Table 1) showing manufacturing parameters for 19 groove forming samples using an alumina main ceramic component (base) and a silica sintering aid according to an embodiment of the disclosure.

FIG. 9 is an exemplary Table 1 which shows manufacturing parameters for 19 groove forming samples using an alumina main ceramic component (base) and a silica sintering aid. In this example, grooves 2 were formed in a sintered ceramic material mainly including alumina by applying a laser beam to the sintered ceramic material, and a study was performed on the influence of the temperature of the laser-irradiated portion on the transverse strength and chipping of a piece obtained by dividing the ceramic member 1 along the grooves 2.

The silica content was also measured in the first region and in the second region, and the cross-section of the groove 2 and the vicinity thereof in the ceramic member 1 was photographed by Scanning Electron Microscope (SEM).

Preparation of Sintered Ceramic Material

The sintered ceramic material was prepared by a process including making a ceramic green sheet from a powder mixture including alumina powder as the main component, silica powder and magnesia powder as additives, and optionally added calcia powder, cutting the ceramic green sheet into a given shape, and then baking the cut piece at a temperature of about 1600° C. The sintered ceramic material was in the form of a rectangular plate of about 152.4 mm×152.4 mm×0.635 mm.

Formation of Grooves

Nine rectangular grooves 2 each with a size of about 50.8 mm×50.8 mm were formed by a process including applying a laser beam to the main surface 10 of the sintered ceramic material, while blowing gas thereto, and moving the location where the laser beam was applied.

Using a $CO_2$ laser oscillator, the laser beam was radiated in a pulse waveform with a relatively slow rise (i.e., T2=100 μsec) as shown in FIG. 8 and an ON signal time T3 of 50 μsec. The pulse period T1 for the pulse oscillation frequency and the laser beam moving speed are as shown in FIG. 9 (Table 1).

In the gas blowing process, compressed air was blown to the laser beam-irradiated portion along the long axis at a pressure of about 0.5 MPa and at a tilt angle θ (FIG. 7) of about 70° with respect to the perpendicular direction.

The solidified melt pushed out to the periphery of the groove 2 by the gas blowing was removed by cutting and then evaluated as described later.

Evaluation of Chipping

Chipping was evaluated by a process including dividing a plurality of ceramic members (such as the ceramic member 1) along the grooves 2 into 50 pieces with respect to each sample, then placing the pieces in a net, and applying ultrasonic vibration to them in water from an ultrasonic vibrator. Ultrasonic vibration conditions were at an oscillating frequency of 28 kHz, a power of 1.5 kW, and a time period of 10 minutes. The presence or absence of chipping was determined by observing the periphery of each piece with a tool maker's microscope at a magnification of 10×.

Figure 10:
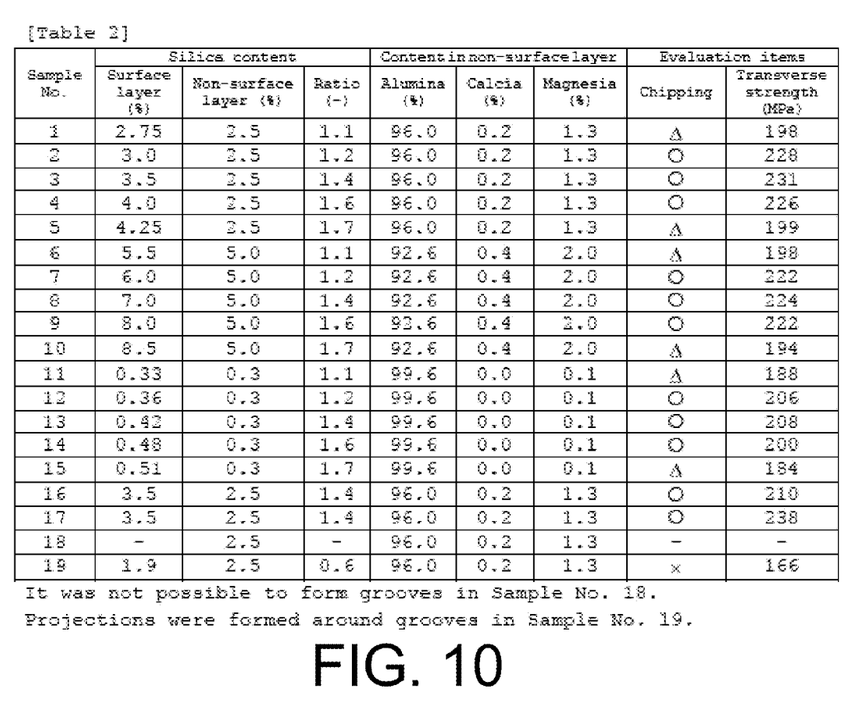
FIG. 10 is an exemplary table (Table 2) showing results of the evaluation of the chipping of the 19 groove forming samples of FIG. 9 (Table 1).
Figure 11:
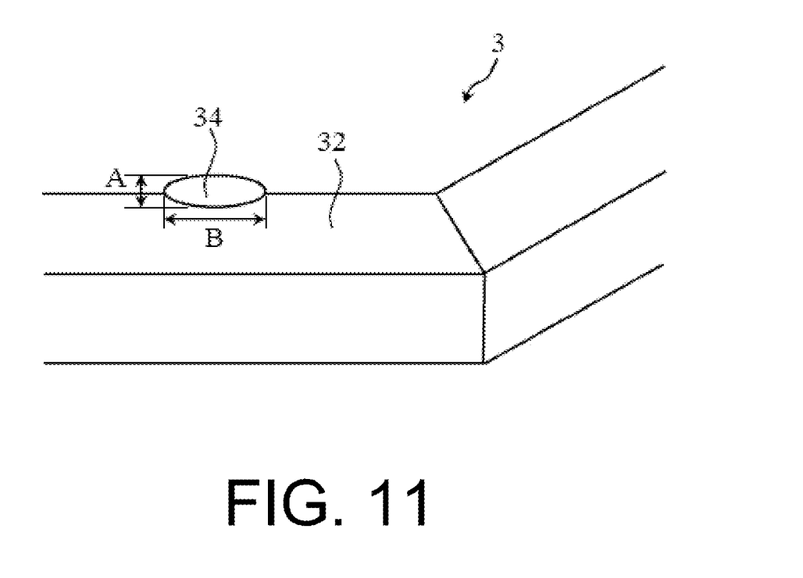
FIG. 11 illustrates a perspective view showing a principal part to illustrate an exemplary method for evaluation of chipping according to an embodiment of the disclosure.

FIG. 10 is a table (Table 2) showing results of the evaluation of the chipping of the 19 groove forming samples of FIG. 9 (Table 1). As shown in FIG. 10, cases where the piece has a chipped portion 34 (FIG. 11) of about 0.4 mm or more in both length A and width B (FIG. 11) are expressed by "x" (poor); cases where the piece has the chipped portion 34 (FIG. 11) of less than about 0.4 mm in both length A and width B (FIG. 11) are expressed by "Δ" (acceptable); and cases where no chipped portion is observed are expressed by "o".

Evaluation of Transverse Strength

Figure 12:
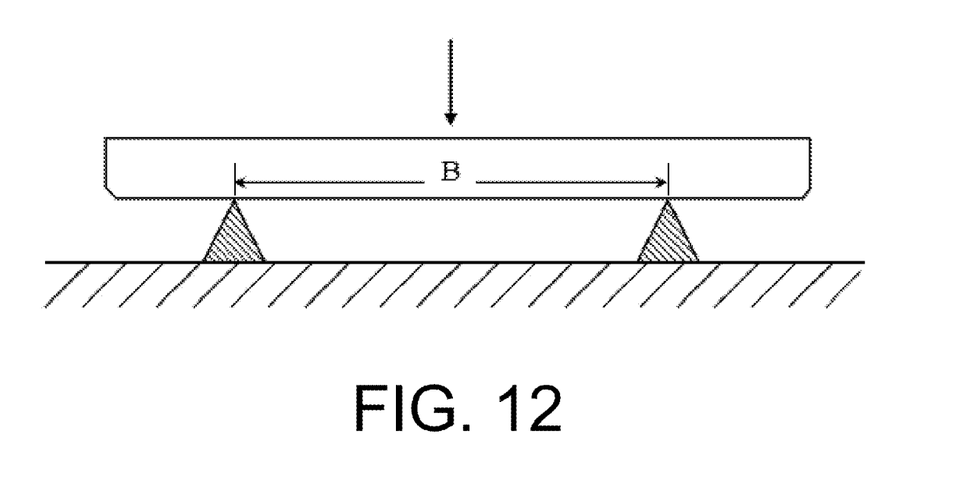
FIG. 12 illustrates a front view for showing a method for measurement of transverse strength according to an embodiment of the disclosure.

FIG. 12 illustrates a front view for showing a method for measurement of transverse strength. The transverse strength of a piece obtained by dividing the ceramic member 1 along the grooves 2 was measured using a Digital Load Tester.

Transverse strength was measured at a crosshead speed of about 0.5 mm/minute with a span S (FIG. 6) of about 30 mm. Each sample was placed with its grooved surface facing downward, and a load was applied to the back surface of the sample so that the profile of the periphery resulting from the grooves 2 was most influenced by the transverse load. The result of the evaluation of the transverse strength is shown in FIG. 10 (Table 2).

Measurement of the Content of Silica and Other Components

The content of silica in the second region was measured by a process including etching the second region by FIB machining, while performing the measurement on a about 50 μm square area using wavelength dispersive EPMA analysis. In the EPMA analysis, carbon or the like was vapor-deposited on the surface to be measured, and the measurement conditions were an accelerating voltage of 15 kV and a probe current of $3 \times 10^{-7}$ A.

The content of silica in the surface layer 20 of the groove 2 was measured by wavelength dispersive EPMA analysis in a about 50 μm square region located at a depth of about 2 μm along the perpendicular direction from the surface 21 of the groove 2. In the EPMA analysis, carbon was vapor-deposited on the surface to be measured, and the measurement conditions were an accelerating voltage of about 15 kV and a probe current of $3.0 \times 10^{-7}$ A. The result of the measurement of the content in each of the second region (non-surface layer) and the surface layer 20 of the groove 2 is shown in FIG. 10 (Table 2). The average content of silica in the second region (non-surface layer), the content of silica in the surface layer 20 of the groove 2, and the ratio therebetween are shown together in FIG. 10 (Table 2).

An average content of each of alumina, calcia and magnesia in the second region (non-surface layer) was also measured by the same method as used for the average content of silica in the second region (non-surface layer). The result of the measurement of the average content of them in the second region (non-surface layer) is also shown in FIG. 10 (Table 2).

Cross-Sectional Scanning Electron Microscope (SEM) Photography

Figure 13A:
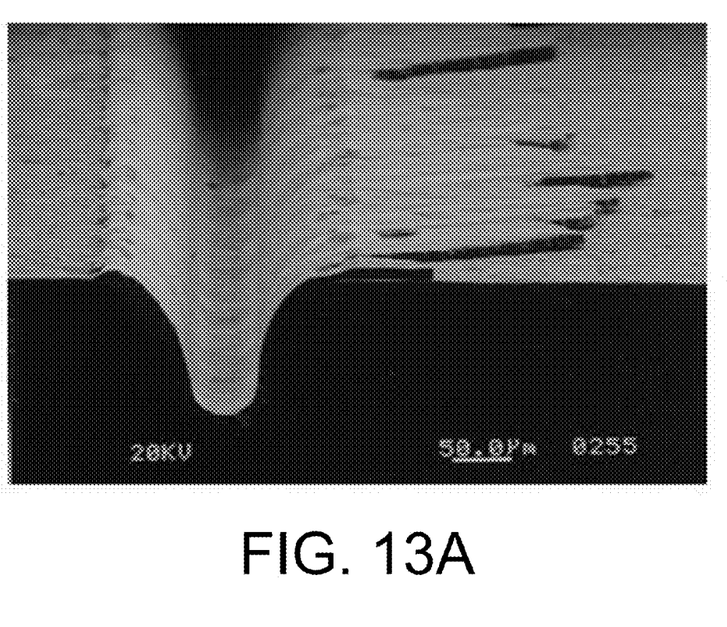
FIG. 13A illustrates a scanning electron microscope (SEM) photograph showing the state of Sample No. 3 before the solidified melt is removed from the Sample No. 3 according to an embodiment of the disclosure.
Figure 13B:
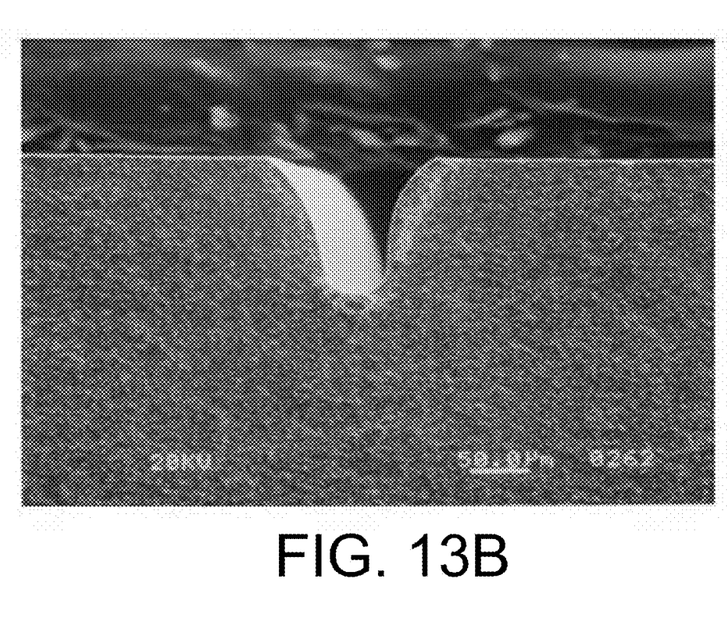
FIG. 13B illustrates an SEM photograph showing the state of Sample No. 3 after the solidified melt is removed from the Sample No. 3 according to an embodiment of the disclosure.
Figure 14A:
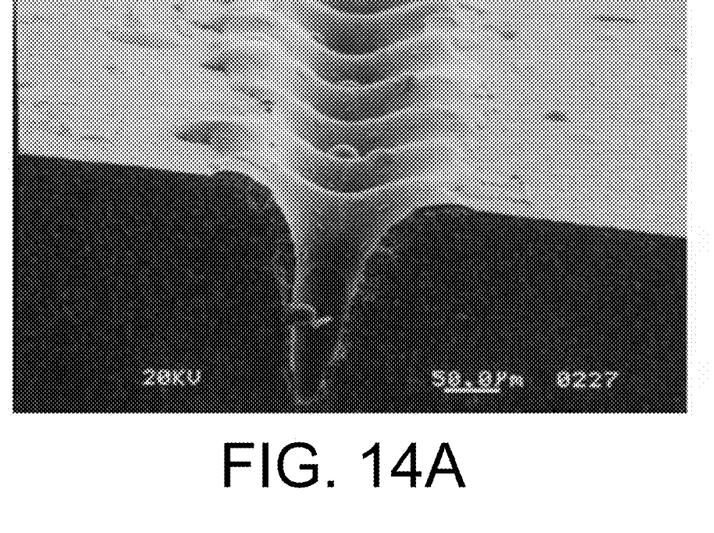
FIG. 14A illustrates an SEM photograph showing the state of Sample No. 19 before the solidified melt is removed from Sample No. 19.

The cross-sectional SEM photography was performed on each of Sample Nos. 3 and 19, before and after the solidified melt was removed. Carbon (C) and gold (Au) were vapor-deposited on the sample, and an energy-dispersive electron reflection image was obtained at a magnification of 150× in the measurement. The results of the cross-sectional SEM photography are shown in FIGS. 13A and 13B for Sample No. 3 and in FIGS. 14A and 14B for Sample No. 19. FIGS. 13A and 14A each show an SEM photography the state before the removal of the solidified melt, and FIGS. 13B and 14B each show an SEM photography the state after the removal of the solidified melt.

As shown in FIG. 10 Sample Nos. 1 to 17 caused no chipping or an acceptable level of chipping and had practically-acceptable high transverse strength.

This result suggests that the temperature of the laser beam-irradiated portion should be from about 2050° C. to about 2980° C. in order to suppress chipping and ensure high transverse strength. In particular, Sample Nos. 2 to 4, 7 to 9, and 12 to 14 each produced using a laser beam-irradiated portion temperature of about 2100° C. to about 2900° C. caused no chipping and had high transverse strength. Therefore, the temperature of the laser beam-irradiated portion is more preferably from about 2100° C. to about 2900° C.

The moving speed of the laser beam-irradiated portion was about 9 m/minute to about 70 m/minute. In this manner, chipping was suppressed, and high transverse strength was obtained in Sample Nos. 1 to 17. In particular, Sample Nos. 2 to 4, 7 to 9, and 12 to 14 each produced using a moving speed of about 10 m/minute to about 60 m/minute caused no chipping and had high transverse strength. Therefore, in one embodiment the moving speed of the laser beam-irradiated portion is preferably from about 9 m/minute to about 70 m/minute, more preferably from about 10 m/minute to about 60 m/minute.

A comparison between Sample Nos. 3, 16, and 17 shows that a pulse oscillation frequency of about 10000 Hz or more for the laser beam irradiation can produce high transverse strength.

The content of silica in the surface layer 20 of the groove 2 was about 1.3 to about 1.6 times higher than the average content of silica in the second region (non-surface layer) in Sample Nos. 1 to 17 resisting chipping and having high transverse strength.

In contrast, it was not possible to form grooves 2 in Sample No. 18, because the temperature of the laser beam-irradiated portion was too low. In Sample No. 19, chipping and a reduction in transverse strength were found, because the moving speed was too low and the irradiation temperature was too high. In Sample No. 18, the content of silica in the surface layer 20 of the groove 2 was also lower than the average content of silica in the second region (non-surface layer).

In order to suppress chipping and ensure high transverse strength, the content of silica in the surface layer 20 of the groove 2 is preferably about 1.2 to about 1.6 times higher than the average content of silica in the second region (non-surface layer).

Figure 14B:
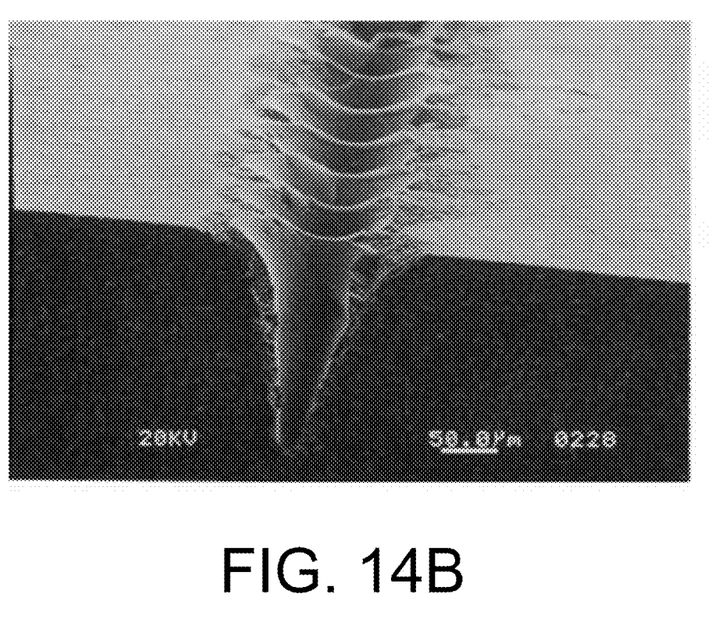
FIG. 14B is an SEM photograph showing the state of Sample No. 19 after the solidified melt is removed from the Sample No. 19.

FIGS. 13A and 13B show that Sample No. 3 with no chipping and high transverse strength had good-looking continuous grooves 2 whose surface and periphery were smooth. In contrast, FIGS. 14A and 14B show that each of the grooves 2 formed in Sample No. 38 looked like a perforated line and that the surface of the periphery of each groove 2 was relatively rough after the removal of the solidified melt.

Example 2

Figure 15:
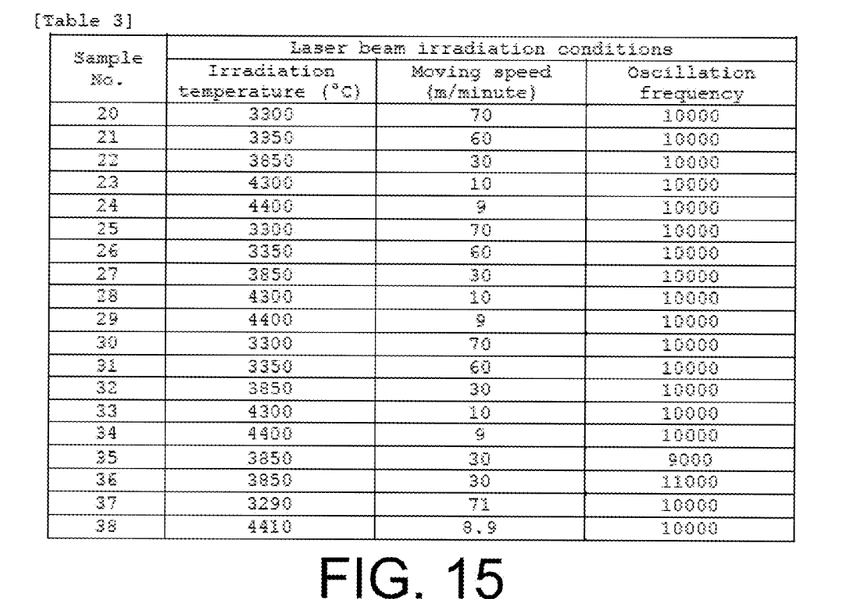
FIG. 15 is an exemplary table (Table 3) showing manufacturing parameters for 19 groove forming samples using a zirconia main ceramic component (base) and a yttria sintering aid according to an embodiment of the disclosure.

FIG. 15 is a table (Table 3) showing manufacturing parameters for 19 groove forming samples using a zirconia main ceramic component (base) and a yttria sintering aid. In this example, grooves 2 were formed in a sintered ceramic material mainly including zirconia by applying a laser beam to the sintered ceramic material, and a study was performed on the influence of the temperature of the laser beam-irradiated portion on the transverse strength and chipping of a piece obtained by dividing the ceramic member 1 along the grooves 2.

A ceramic member 1 was produced under the same conditions as those in Example 1, except that a powder mixture of zirconia powder and yttria powder was used instead.

The grooves 2 were formed under the same conditions as those in Example 1, except that the conditions shown FIG. 15 (Table 3) were used in Example 2.

Figure 16:
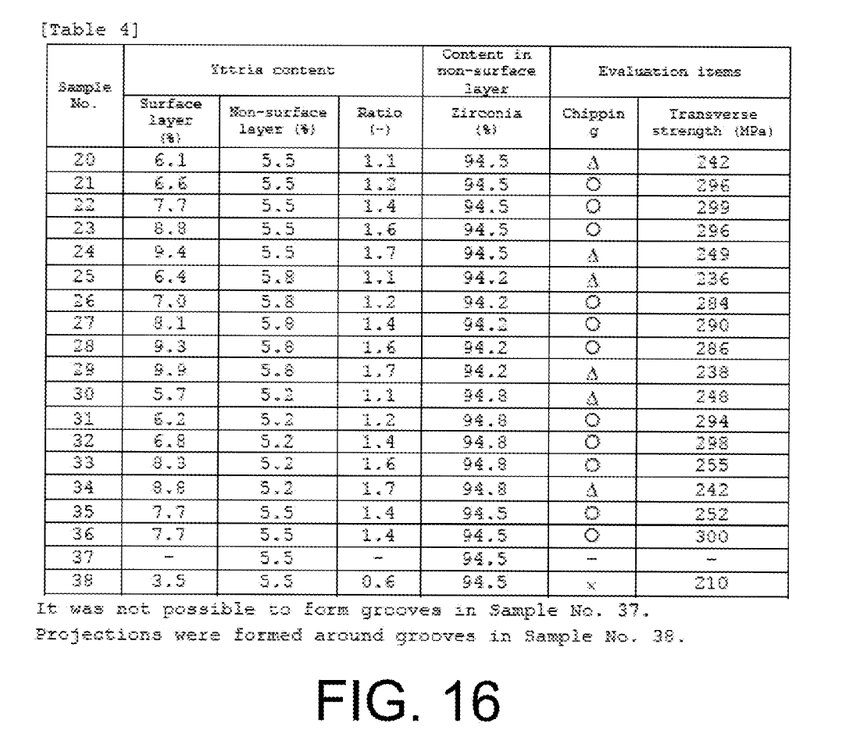
FIG. 16 is an exemplary table (Table 4) showing results of manufacturing the 19 groove forming samples of FIG. 15.

Chipping and the transverse strength were evaluated in the same manner as in Example 1. The results are shown in FIG. 16 (Table 4). The content of yttria was measured in the second region (non-surface layer) and in the surface layer 20 of the groove 2 by the same method as that in Example 1. The result is shown in FIG. 16 (Table 4). The average content of yttria in the second region (non-surface layer), the content of yttria in the surface layer 20 of the groove 2, and the ratio therebetween are shown together in FIG. 16 (Table 4).

FIG. 16 (Table 4) shows results of manufacturing the 19 groove forming samples of FIG. 15. FIG. 16 shows Sample Nos. 20 to 36 caused no chipping or an acceptable level of chipping and had practically-acceptable high transverse strength. This result suggests that the temperature of the laser beam-irradiated portion should be from about 3300° C. to about 4400° C. in order to suppress chipping and ensure high transverse strength. In particular, Sample Nos. 21 to 23, 26 to 28, and 31 to 33 each produced using a laser beam-irradiated portion temperature of about 3350° C. to about 4300° C. caused no chipping and had high transverse strength. Therefore, the temperature of the laser-irradiated portion is more preferably from about 3350° C. to about 4300° C.

The moving speed of the laser-irradiated portion was about 9 m/minute to about 70 m/minute. In this manner, chipping was suppressed, and high transverse strength was obtained in Sample Nos. 20 to 36. In particular, Sample Nos. 21 to 23, 26 to 28, and 31 to 33 each produced using a moving speed of 10 m/minute to 60 m/minute caused no chipping and had high transverse strength. Therefore, the moving speed of the laser beam-irradiated portion is preferably from about 9 m/minute to about 70 m/minute, more preferably from 10 m/minute to 60 m/minute.

A comparison between Sample Nos. 23, 35, and 36 shows that a pulse oscillation frequency of about 10,000 Hz or more for the laser beam irradiation can produce high transverse strength.

The content of yttria in the surface layer 20 of the groove 2 was about 1.3 to about 1.6 times higher than the average content of yttria in the second region (non-surface layer) in Sample Nos. 20 to 36 resisting chipping and having high transverse strength.

In contrast, it was not possible to form grooves 2 in Sample No. 37, because the temperature of the laser beam-irradiated portion was too low. In Sample No. 38, chipping and a reduction in transverse strength were found, because the moving speed was too low and the irradiation temperature was too high. In Sample No. 37, the content of yttria in the surface layer 20 of the groove 2 was also lower than the average content of yttria in the non-surface layer.

In order to suppress chipping and ensure high transverse strength, the content of yttria in the surface layer 20 of the groove 2 should preferably be 1.2 to 1.6 times higher than the average content of yttria in the non-surface layer.

Figure 17:
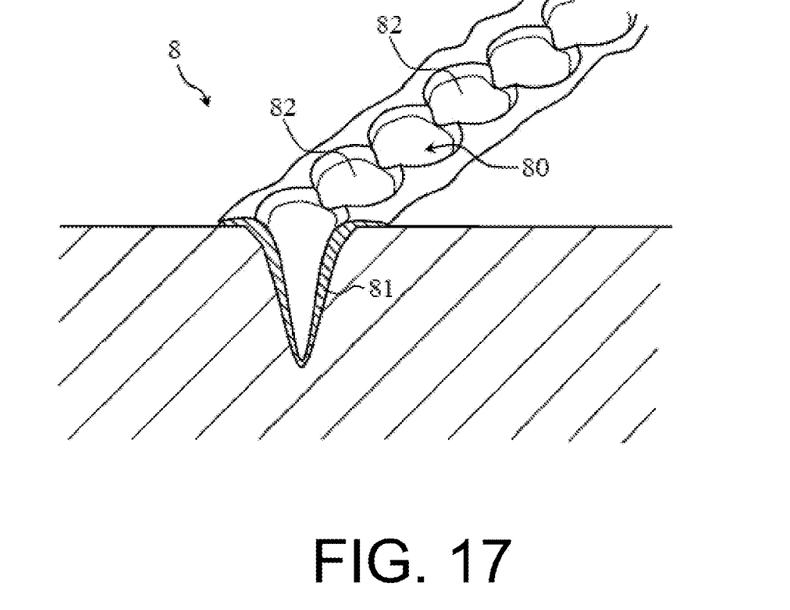
FIG. 17 illustrates a perspective view showing a principal part of a structure of a ceramic member having a groove formed by a conventional laser machining method.

FIG. 17 illustrates a perspective view showing the principal part of a structure of a ceramic member 8 having a groove 80 formed by a conventional laser machining method. However, in the conventional laser machining method (i.e., abrasion), the work piece is processed at a temperature higher than the boiling point of its main component, so that as shown in FIG. 17, a surface layer 81 of a groove 80 significantly loses a sintering aid such as silica so as to become silica-poor as mentioned above. As a result, bonding between grains of the main ceramic component is reduced in the surface layer 81 of the groove 80. Therefore, a piece obtained by dividing the ceramic member 8 along the groove 80, such as a substrate for electronic parts, can be easily chipped at its end face 90 formed by the dividing process, upon contact with something or the like.

When a groove 80 is formed in a relatively thick ceramic member 8, high power is necessary, and therefore, pulsed oscillation of a high-power laser such as a CO2 laser has to be used. When the ceramic member 8 is processed at a temperature equal to or higher than the melting point of its main component using such a high-power laser beam, the groove 80 is formed of a plurality of spots 82 overlapping in the moving direction of the laser beam similar to a perforated line.

Figure 18:
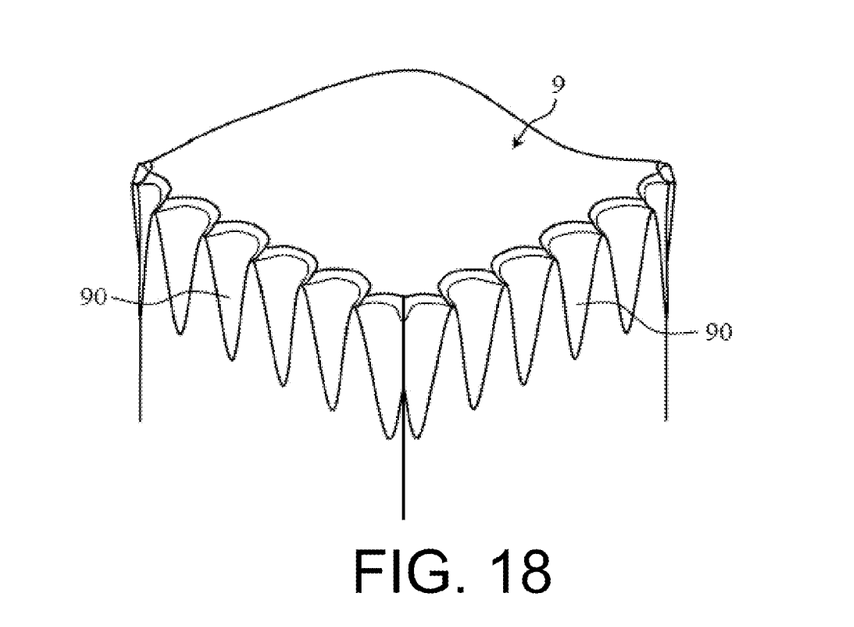
FIG. 18 illustrates a perspective view showing the principal part of a piece obtained by cutting the ceramic member of FIG. 17 along the groove.

FIG. 18 illustrates a perspective view showing the principal part of a piece obtained by cutting the ceramic member 8 of FIG. 17 along the groove 80. As shown in FIG. 18, a piece obtained by dividing the ceramic member 8 along the groove 80, such as a substrate for electronic parts, has a ripple-shaped (as explained above) end face 90, which is formed by the dividing process. The piece 9 having the rippled-shaped end face 90 can be not only easily chipped at the end face 90 upon contact with an object or the like but can also be reduced in transverse strength.

While at least one exemplary embodiment has been presented in the foregoing detailed description, the present disclosure is not limited to the above-described embodiment or embodiments. Variations may be apparent to those skilled in the art. In carrying out the present disclosure, various modifications, combinations, sub-combinations and alterations may occur in regard to the elements of the above-described embodiment insofar as they are within the technical scope of the present disclosure or the equivalents thereof. The exemplary embodiment or exemplary embodiments are examples, and are not intended to limit the scope, applicability, or configuration of the disclosure in any way. Rather, the foregoing detailed description will provide those skilled in the art with a template for implementing the exemplary embodiment or exemplary embodiments. It should be understood that various changes can be made in the function and arrangement of elements without departing from the scope of the disclosure as set forth in the appended claims and the legal equivalents thereof.

Terms and phrases used in this document, and variations thereof, unless otherwise expressly stated, should be construed as open ended as opposed to limiting. As examples of the foregoing: the term "including" should be read as mean "including, without limitation" or the like; the term "example" is used to provide exemplary instances of the item in discussion, not an exhaustive or limiting list thereof; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise. Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

What is claimed is:

1. A ceramic member comprising:
    at least one groove formed in a surface of the ceramic member;
    a first region located at a first depth ranging from about 1 µm to about 10 µm perpendicular to a surface of the at least one groove;
    a second region located at a second depth ranging from about 60 µm to about 70 µm perpendicular to the surface of the at least one groove; and
    a sintering aid, wherein a content of the sintering aid is higher in the first region than in the second region.

2. The ceramic member according to claim 1, wherein the first region forms a surface layer and the content of sintering aid in the surface layer is about 1.2 to about 1.6 times an average content of sintering aid in the second region.

3. The ceramic member according to claim 1, wherein the ceramic member is configured to be divided along the at least one groove into a plurality of substrates for use in electronic parts.

4. The ceramic member according to claim 1, wherein the ceramic member comprises alumina as a main component, and the sintering aid comprises silica.

5. The ceramic member according to claim 4, wherein the ceramic member comprises an average alumina content of about 92.6% by mass to about 99.6% by mass and an average silica content of about 0.3% by mass to about 5.0% by mass.

6. The ceramic member according to claim 5, further comprising calcia and magnesia, wherein the ceramic member comprises an average calcia content of about 0% by mass to about 0.4% by mass and an average magnesia content of about 0.1% by mass to about 2.0% by mass.

7. The ceramic member according to claim 1, wherein the ceramic member comprises zirconia as a main component, and the sintering aid comprises yttria.

8. The ceramic member according to claim 7, wherein the second region comprises an average zirconia content of about 94.2% by mass to about 94.8% by mass and an average yttria content of about 5.2% by mass to about 5.8% by mass.

9. A substrate for electronic parts, comprising:
    a ceramic member;
    a groove formed in a peripheral portion of the ceramic member;
    a first region located at a first depth ranging from about 1 µm to about 10 µm perpendicular to a surface of the groove;
    a second region located at a second depth ranging from about 60 µm to about 70 µm perpendicular to the surface of the groove; and
    a sintering aid, wherein a content of the sintering aid is higher in the first region than in the second region.

10. The substrate of claim 9, wherein the sintering aid comprises at least one of the group consisting of: silica, and yttria.

11. The substrate of claim 9, wherein the peripheral portion is located on a side of the substrate, wherein the side comprises at least one of the group consisting of: a main side, and a back side.

* * * * *